United States Patent
Lee et al.

(10) Patent No.: US 10,162,207 B2
(45) Date of Patent: Dec. 25, 2018

(54) ULTRA HIGH RESOLUTION LIQUID CRYSTAL DISPLAY

(71) Applicant: LG Display Co., Ltd., Seoul (KR)

(72) Inventors: Sul Lee, Goyang-si (KR); Sunhwa Lee, Paju-si (KR); Seongjun Cho, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/798,526

(22) Filed: Oct. 31, 2017

(65) Prior Publication Data

US 2018/0122832 A1    May 3, 2018

(30) Foreign Application Priority Data

Oct. 31, 2016 (KR) .................. 10-2016-0143999

(51) Int. Cl.
  *G02F 1/1362*    (2006.01)
  *H01L 27/12*    (2006.01)
  (Continued)

(52) U.S. Cl.
  CPC ...... *G02F 1/133345* (2013.01); *G02F 1/1368* (2013.01); *G02F 1/13624* (2013.01);
  (Continued)

(58) Field of Classification Search
  CPC ....... G02F 1/13624; G02F 2001/13624; G02F 2201/40; G02F 2202/104; H01L 27/1214–27/1296
  See application file for complete search history.

(56) References Cited

U.S. PATENT DOCUMENTS 10,002,968 B2   6/2018   Yoneda
10,031,372 B2   7/2018   Ochiai et al.
(Continued)

FOREIGN PATENT DOCUMENTS

JP   2003-152191 A   5/2003
JP   2007-251100 A   9/2007
(Continued)

OTHER PUBLICATIONS

Extended European Search Report dated Apr. 10, 2018, issued in corresponding European Patent Application No. 17199081.5.
(Continued)

*Primary Examiner* — Daniel P Shook
(74) *Attorney, Agent, or Firm* — Morgan, Lewis & Bockius LLP

(57) ABSTRACT

The present disclosure relates to an ultra high resolution liquid crystal display having a compensation thin film transistor. The present disclosure provides an ultra high density liquid crystal display comprising: a gate line on a substrate; a first gate insulating layer on the gate line; a first semiconductor layer crossing the gate line on the first gate insulating layer; a second gate insulating layer on the first semiconductor layer; a second semiconductor layer crossing the gate line on the second gate insulating layer; an intermediate insulating layer on the second semiconductor layer; a data line connected to the first semiconductor layer on the intermediate insulating layer; and a drain electrode connected to the second semiconductor layer on the intermediate insulating layer.

14 Claims, 10 Drawing Sheets

(51) Int. Cl.
*G02F 1/1333* (2006.01)
*G02F 1/1368* (2006.01)
*G02F 1/1343* (2006.01)

(52) U.S. Cl.
CPC .... *G02F 1/136286* (2013.01); *H01L 27/1214* (2013.01); *G02F 2001/134372* (2013.01); *G02F 2201/121* (2013.01); *G02F 2201/123* (2013.01); *G02F 2201/40* (2013.01); *G02F 2202/104* (2013.01)

(56) References Cited

U.S. PATENT DOCUMENTS

| | | | |
|---|---|---|---|
| 2003/0141504 A1 | 7/2003 | Kuwabara et al. | |
| 2009/0014799 A1 | 1/2009 | Isobe | |
| 2014/0183539 A1* | 7/2014 | Lee | G02F 1/13624 |
| | | | 257/72 |
| 2016/0300859 A1 | 10/2016 | Moon et al. | |

FOREIGN PATENT DOCUMENTS

| | | |
|---|---|---|
| JP | 2009-038368 A | 2/2009 |
| JP | 2009-204681 A | 9/2009 |
| JP | 2009-276508 A | 11/2009 |
| JP | 2011-077424 A | 4/2011 |
| JP | 2013-145878 A | 7/2013 |
| KR | 10-2016-0002551 A | 1/2016 |

OTHER PUBLICATIONS

Office Action dated Aug. 28, 2018, issued in corresponding Japanese Patent Application No. 2017-209316.

* cited by examiner

ULTRA HIGH RESOLUTION LIQUID CRYSTAL DISPLAY

CROSS-REFERENCE TO RELATED APPLICATION

This application claims priority to Republic of Korea Patent Application No. 10-2016-0143999 filed on Oct. 31, 2016, which is incorporated by reference herein in its entirety.

BACKGROUND

Technical Field

The present disclosure relates to an ultra high resolution liquid crystal display having a compensation thin film transistor. Especially, the present disclosure relates to a pixel structure for ensuring a high aperture ratio for an ultra high resolution liquid crystal display in which an additional thin film transistor for compensating the On/Off characteristics of the thin film transistor for driving the pixel.

Discussion of the Related Art

Nowadays, as the information society is developed, the requirements of displays for representing information are increasing. Accordingly, the various flat panel displays (or 'FPD') are developed for overcoming many drawbacks of the cathode ray tube (or 'CRT') such as heavy weight and bulk volume. The flat panel display devices include the liquid crystal display device (or 'LCD'), the field emission display (or 'FED'), the plasma display panel (or 'PDP'), the organic light emitting display device (or 'OLED') and the electrophoresis display device (or 'ED').

The display panel of a flat panel display may include a thin film transistor substrate having a thin film transistor allocated in each pixel region arrayed in a matrix manner. For example, the liquid crystal display device represents video data by controlling the light transitivity of the liquid crystal layer using the electric fields. According to the direction of the electric field, the LCD can be classified in the two major types; one is vertical electric field type and the other is the horizontal electric field type.

For the vertical electric field type LCD, a common electrode formed on an upper substrate and a pixel electrode formed on a lower substrate are facing with each other for forming an electric field of which direction is perpendicular to the substrate face. A twisted nematic (TN) liquid crystal layer disposed between the upper substrate and the lower substrate is driven by the vertical electric field. The vertical electric field type LCD has merit of higher aperture ratio, while it has demerit of narrower view angle about 90 degree.

For the horizontal electric field type LCD, a common electrode and a pixel electrode are formed on the same substrate in parallel. A liquid crystal layer disposed between an upper substrate and a lower substrate is driven in In-Plane-Switching (or 'IPS') mode by an electric field parallel to the substrate face. The horizontal electric field type LCD has a merit of wider view angle over 160 degrees and faster response speed than the vertical electric field type LCD. However, the horizontal electric field type LCD may have demerits such as low aperture ratio and transitivity ratio of the back light.

In the IPS mode LCD, for example, in order to form the in-plane electric field, the gap between the common electrode and the pixel electrode may be larger than the gap (or "Cell Gap") between the upper substrate and the lower substrate, and in order to get enough strength of the electric field, the common electrode and the pixel electrode may have a strip pattern having certain width. Between the pixel electrode and the common electrode of the IPS mode LCD, the electric field horizontal with the substrate is formed. However, just over the pixel electrode and the common electrode, there is no electric field. That is, the liquid crystal molecules disposed just over the pixel electrodes and the common electrodes are not driven but maintain the initial conditions (the initial alignment direction). As the liquid crystal molecules in the initial condition cannot control the light transitivity properly, the aperture ratio and the luminescence may be degraded.

For resolving these demerits of the IPS mode LCD, the fringe field switching (or 'FFS') type LCD driven by the fringe electric field has been proposed. The FFS type LCD comprises the common electrode and the pixel electrode with the insulating layer there-between. The pixel electrode and the common electrode are overlapped vertically. Otherwise, the pixel electrode and the common electrode are not overlapped each other but separated with a gap setting narrower than the gap between the upper substrate and the lower substrate. So that, a fringe electric field having a parabola shape is formed in the space between the common electrode and the pixel electrode as well over these electrodes. Therefore, most of all liquid crystal molecules disposed between the upper substrate and the lower substrate can be driven by this fringe field. As a result, it is possible to enhance the aperture ratio and the front luminescence.

FIG. 1 is a plane view illustrating a thin film transistor substrate having an oxide semiconductor layer included in a fringe field type liquid crystal display according to the related art. FIG. 2 is a cross-sectional view illustrating the structure of the thin film transistor substrate of FIG. 1 by cutting along the line I-I' according to the related art.

The thin film transistor substrate having a metal oxide semiconductor layer shown in FIGS. 1 and 2 comprises a gate line GL and a data line DL crossing each other with a gate insulating layer GI therebetween on a lower substrate SUB, and a thin film transistor T formed at each crossing portion. By the crossing structure of the gate line GL and the data line DL, a pixel region is defined. In the pixel region, a pixel electrode PXL and a common electrode COM are formed with the second passivation layer PA2 there-between, to form a fringe electric field. The pixel electrode PXL may have a rectangular shape corresponding to the pixel area, and the common electrode COM may have a plurality of segments being parallel with a predetermined distance.

The common electrode COM is connected to the common line CL disposed in parallel with the gate line GL. The common electrode COM is supplied with a reference voltage (or "common voltage") via the common line CL.

Responding to the gate signal provided to the gate line GL, The thin film transistor T supplies and keeps the pixel signal provided via the data line DL to the pixel electrode PXL. To do so, the thin film transistor T comprises a gate electrode G extruded from the gate line GL, a source electrode S extruded from the data line DL, a drain electrode D facing the source electrode S and connecting the pixel electrode PXL, and a semiconductor layer SE. The semiconductor layer SE has a (semiconductor) channel area A overlapped with the gate electrode G on the gate insulating layer GI and defined between the source electrode S and the drain electrode D.

The semiconductor layer SE includes a polycrystalline silicon material. The middle portion of the semiconductor layer SE overlapped with the gate electrode G is defined as the channel area A. The other areas of the polycrystalline semiconductor material except the channel area A are conductorized by plasma treatment; one area contact the source electrode S via the source contact hole SH and the other area contact the drain electrode D via the drain contact hole DH, respectively. The polycrystalline semiconductor layer SE includes the source area SA contacting the source electrode S, the drain area DA contacting the drain electrode D and the channel area A overlapped with the gate electrode G between the source area SA and the drain area DA.

For the fringe field switching type, the pixel electrode PXL is overlapped with the common electrode COM. The storage capacitance is formed at this overlapped area. Therefore, in order to fully charge the storage capacitance, the thin film transistor has the characteristics for controlling high current amount. For the fringe field type, considering the performance and conditions, it is preferable that the thin film transistor has the top gate structure with the polycrystalline semiconductor material.

Referring to FIG. 2, we will explain about the top gate thin film transistor having the polycrystalline semiconductor material. A semiconductor layer SE is firstly formed on a substrate SUB. A gate insulating layer GI is deposited over the substrate SUB having the semiconductor layer SE. A gate electrode G is formed on the gate insulating layer GI as overlapping with the middle portion of the semiconductor layer SE to define the channel area A.

An intermediate insulating layer IN is deposited on the gate electrode G as covering the whole surface of the substrate SUB. A source contact hole SH exposing the source area SA of the semiconductor layer SE and a drain contact hole DH exposing the drain area DA are formed by penetrating the intermediate insulating layer IN and the gate insulating layer GI. On the intermediate insulating layer IN, the source electrode S contacting the source area SA via the source contact hole SH and the drain electrode D contacting the drain area DA via the drain contact hole DH are formed.

A first passivation layer PAS1 is deposited on the top gate type thin film transistor T as covering the whole surface of the substrate SUB. A pixel contact hole PH is formed as exposing some of the drain electrode D by penetrating the first passivation layer PAS1.

The pixel electrode PXL formed on the first passivation layer PAS1 contacts the drain electrode D via the pixel contact hole PH. The common electrode COM is formed on the second passivation layer PAS2 covering the pixel electrode PXL so that the common electrode COM and the pixel electrode PXL are overlapped. The fringe electric field is formed between the pixel electrode PXL and the common electrode COM. Further, at the second passivation layer PAS2 between the overlapped pixel electrode PXL and the common electrode COM, a storage capacitance is formed. The molecules of the liquid crystal material arrayed in a horizontal direction between the thin film transistor substrate and the color filter substrate are rotated according to the dielectric anisotropy of the liquid crystal material controlled by the fringe electric field. According to the rotated amount of the liquid crystal molecules, at the pixel area, the light transmittance is changed so that the grey scale can be represented.

The thin film transistor including the polycrystalline semiconductor material has the characteristics in which the Off-Current feature would be easily degraded. In order to compensate the deteriorated Off-current feature, a compensation thin film transistor is required.

Hereinafter, referring to FIG. 3, we will explain about the liquid crystal display including a compensation thin film transistor. FIG. 3 is a plan view illustrating a thin film transistor substrate for a liquid crystal display including a compensation thin film transistor according to the related art.

The thin film transistor substrate including a compensation thin film transistor comprises a plurality of pixel areas defined by the gate line GL and the data line DL crossing each other on the lower substrate SUB. In each pixel area, a pixel electrode PXL and a common electrode COM are formed for forming the fringe electric field as overlapped each other with a gate insulating layer GI there-between. The pixel electrode PXL has a rectangular shape corresponding to the pixel area, and the common electrode COM has a plurality of segments arrayed in parallel each other.

At each pixel area, at least one thin film transistor T1 is disposed. Further, a compensation thin film transistor T2 is disposed for compensating the Off-current feature of the thin film transistor T1. The drain electrode D1 of the thin film transistor T1 contacts to the source electrode S2 of the compensation thin film transistor T2.

We will explain about the structure of the thin film transistor substrate having the thin film transistor T1 and the compensation thin film transistor T2 serially connected. On the substrate SUB, a plurality of pixel areas is defined by the crossing structure of the gate lines GL running to the horizontal (first) direction and the data line DL running to the vertical (second) direction.

The first gate electrode G1 of the thin film transistor T1 is extruded from the gate line GL to the opposite direction from the pixel area. The first source electrode Si of the thin film transistor T1 is extruded from the data line DL to the first gate electrode G1. The semiconductor layer SE is extended as starting from one end portion, the first source area SA1, connected to the first source electrode S1 of the thin film transistor T1 to the other end portion, the second drain area DA2, connected to the second drain electrode D2 of the compensation thin film transistor T2. The semiconductor layer SE crosses the first gate electrode G1 of the thin film transistor T1 and the second gate electrode G2 of the compensation thin film transistor T2 serially. The first drain electrode D1 of the thin film transistor T1 is not formed of metal layer. The first drain area DA1 works as the first drain electrode D1 of the thin film transistor T1. The first drain area DA1 is some portions of the semiconductor layer SE which is extended from the first channel area A1 overlapped with the first gate electrode G1 and is facing the first source area SA1.

The second gate electrode G2 of the compensation thin film transistor T2 is some portions of the gate line DL. The second source electrode S2 of the compensation thin film transistor T2 is not formed of the metal layer. The second source area SA2 of the semiconductor layer SE extended from the first drain area DA1 works as the second source electrode S2 of the compensation thin film transistor T2. The second drain electrode D2 of the compensation thin film transistor T2 is connected to the second drain area DA2 of the semiconductor layer SE. The semiconductor layer SE crosses the second gate electrode G2, some portion of the gate line GL, and extended to the pixel area. The second channel area A2 is overlapped with the second gate electrode G2. The second drain area DA2 is extended from the second channel area A2 and is facing the second source area SA2.

In order to connect the thin film transistor T1 to the compensation thin film transistor T2 in serial, the first gate electrode G1 of the thin film transistor T1 is extruded from the gate line GL to the neighboring pixel area located at next row. The semiconductor layer SE is extended from the neighboring pixel area to the pixel area. The semiconductor layer SE is overlapped with the first gate electrode G1 and then with the second gate electrode G2, some portions of the gate line GL. The second drain electrode D2 of the compensation thin film transistor T2 connects the pixel electrode PXL formed in the pixel area.

The pixel electrode PXL is overlapped with the common electrode COM having a passivation layer PAS there-between, in the cross sectional structure. The common electrode COM is connected to the common line being parallel with the gate line GL. The common voltage (or low level voltage) for driving the liquid crystal is supplied to the common electrode COM through the common line CL. Between the pixel electrode PXL and the common electrode COM, the horizontal fringe electric field is formed. In addition, the storage capacitance is formed at the overlapped area between the pixel electrode PXL and the common electrode COM. The liquid crystal molecules, arrayed in plan direction between the thin film transistor substrate and the color filter substrate, are rotated by the dielectric anisotropy controlled by the horizontal fringe electric field. According to the rotating amount of the liquid crystal molecules, the light transmittance amount, the brightness, is changed to represent the gray scale.

For the liquid crystal display having 300 PPI (or Pixel Per Inch) or less resolution, the pixel area has relatively large size, so that the size ratio of the thin film transistor T1 and the compensation thin film transistor T2 is not too high. Further the fringe field type liquid crystal display forms the storage capacitance at the overlapped area between the pixel electrode PXL and the common electrode COM, nor requiring additional area. Therefore, the aperture ratio is not so reduced due to the size of the compensation thin film transistor.

The structure as shown in FIG. 3 is applied to the liquid crystal display having 300 PPI or less resolution. The second gate electrode G2 of the compensation thin film transistor T2 is formed at some portion of the gate line GL. The area ratio of the thin film transistor T1 and the compensation thin film transistor T2 to the pixel area would be kept in low value enough to ensure wanted aperture ratio. However, for the liquid crystal display having 300 PPI or more resolution, it is hard to ensure the enough aperture ratios and/or the enough maximum brightness.

For the ultra high density liquid crystal display having the resolution over 300 PPI (moreover over 500 PPI), the size of the pixel area is remarkably reduced than the liquid crystal display having the 300 PPI or less resolution. However the size of the thin film transistors T1 and T2 is not reduced in order to maintain the proper characteristics. That is, for the ultra high density liquid crystal display, the area ratio of the thin film transistor to the pixel area is remarkably increased. The areas for the thin film transistors T1 and T2 are the non-aperture areas, so that these areas are main causes for reduction of the aperture ratio. A new structure is required for increasing the aperture ratio for the ultra high density liquid crystal display having the resolution over 500 PPI.

SUMMARY

Accordingly, embodiments of the present disclosure are directed to an ultra high resolution liquid crystal display that substantially obviates one or more of the problems due to limitations and disadvantages of the related art.

An aspect of the present disclosure is to provide a liquid crystal display including a compensation thin film transistor for compensating the Off-current feature of the thin film transistor having a polycrystalline semiconductor material. Another aspect of the present disclosure is to provide a liquid crystal display for an ultra high density over 500 PPI resolution, and for the high aperture ratio with the polycrystalline semiconductor material.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an ultra high density liquid crystal display comprises a gate line on a substrate; a first gate insulating layer on the gate line; a first semiconductor layer crossing the gate line on the first gate insulating layer; a second gate insulating layer on the first semiconductor layer; a second semiconductor layer crossing the gate line on the second gate insulating layer; an intermediate insulating layer on the second semiconductor layer; a data line connected to the first semiconductor layer on the intermediate insulating layer; and a drain electrode connected to the second semiconductor layer on the intermediate insulating layer.

In some embodiments, the liquid crystal display further comprises: a planar layer on the data line and the drain electrode; a common electrode on the planar layer; a passivation layer on the common electrode; and a pixel electrode connected to the drain electrode on the passivation layer.

In some embodiments, the first semiconductor layer includes: a first source area connected to the data line; a first channel area overlapped with the gate line; and a first drain area facing the first source area based on the first channel area.

In some embodiments, the second semiconductor layer includes: a second source area connected to the first drain area; a second channel area overlapped with the gate line; and a second drain area facing the second source area based on the second channel area.

In some embodiments, the first semiconductor layer has a first segment shape parallel with and overlapping with the data line; and the second semiconductor layer has a second segment shape overlapping with the first semiconductor layer.

In some embodiments, the drain electrode has an 'L' shape overlapping with the data line and the gate line.

In some embodiments, the first semiconductor layer has a first segment shape parallel with and overlapped with the data line; and the second semiconductor layer has a second segment shape detoured around the first semiconductor layer.

In some embodiments, one end of the first semiconductor layer is connected to another end of the second semiconductor layer for forming a 'V' shape.

In some embodiments, the drain electrode has a rectangular shape being extended from the second drain area to the gate line.

In another aspect, a liquid crystal display comprises a first semiconductor layer on a substrate; an insulating layer on the first semiconductor layer; a second semiconductor layer on the insulating layer; a gate electrode overlapped with center portions of the first semiconductor layer and the second semiconductor layer; a source electrode connected to a first area of the first semiconductor layer; and a drain electrode connected to a second area of the second semiconductor layer, wherein a second area of the first semiconductor layer is connected to a first area of the second semiconductor layer.

In some embodiments, the liquid crystal display further comprises: a gate insulating layer under the first semiconductor layer; and an intermediate insulating layer on the second semiconductor layer, wherein the gate electrode is disposed under the gate insulating layer, and wherein the source electrode and the drain electrode are disposed on the intermediate insulating layer.

In some embodiments, the insulating layer includes a first insulating layer and a second insulating layer sequentially stacked; the gate electrode is disposed between the first insulating layer and the second insulating layer; and the source electrode and the drain electrode is disposed on the intermediate insulating layer.

In some embodiments, the insulating layer includes a first insulating layer and a second insulating layer sequentially stacked; the gate electrode is disposed between the first insulating layer and the second insulating layer; and the source electrode and the drain electrode is disposed on the second insulating layer.

In some embodiments, the liquid crystal display further comprises: a planar layer on the source electrode and the drain electrode; a common electrode on the planar layer; a passivation layer on the common electrode; and a pixel electrode connected to the drain electrode on the passivation layer.

The thin film transistor substrate for the liquid crystal display according to the present disclosure includes a compensation thin film transistor at every pixel area for compensating the Off-current feature of the polycrystalline semiconductor material, so that a better quality of the video image can be provided. The liquid crystal display according to the present disclosure has the structure for minimizing the reduction of the aperture ratio which may be caused when the compensation thin film transistor is included in every pixel area. Therefore, the present disclosure provides the merit for ensuring high aperture ratio at the ultra high density liquid crystal display over 300 PPI or moreover 500 PPI.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the invention and are incorporated in and constitute a part of this specification, illustrate embodiments of the disclosure and together with the description serve to explain the principles of the invention.

DETAILED DESCRIPTION OF THE ILLUSTRATED EMBODIMENTS

Figure 1:
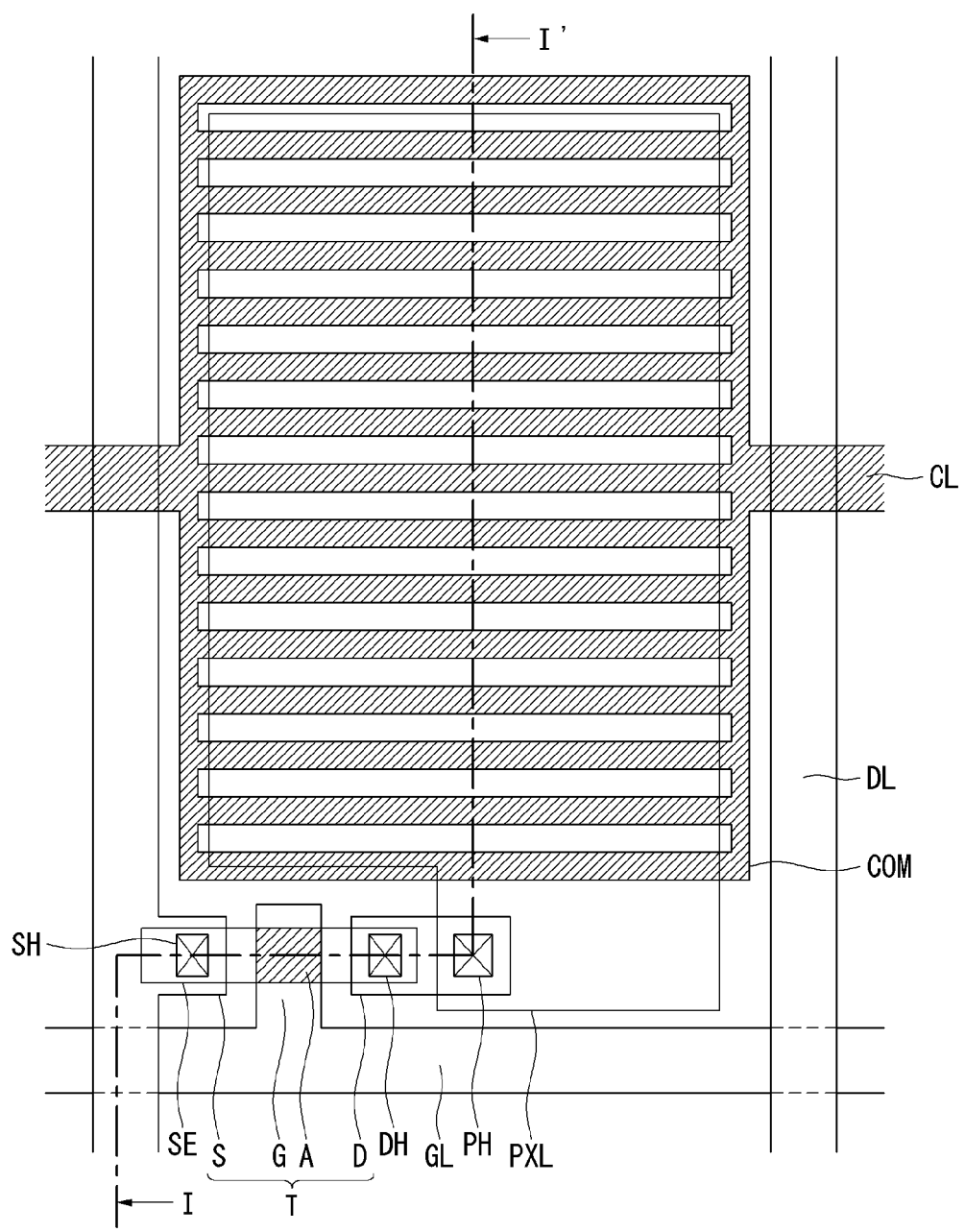
FIG. 1 is a plane view illustrating a thin film transistor substrate included in a fringe field type liquid crystal display according to the related art.
Figure 2:
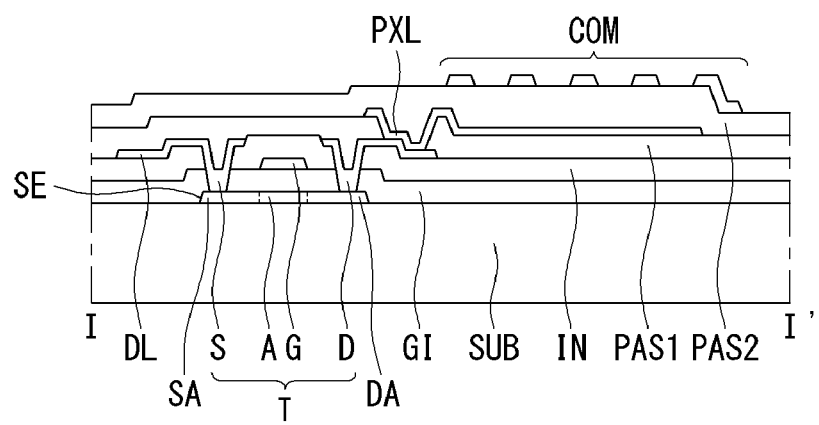
FIG. 2 is a cross-sectional view illustrating the structure of the thin film transistor substrate of FIG. 1 along the line I-I' according to the related art.
Figure 3:
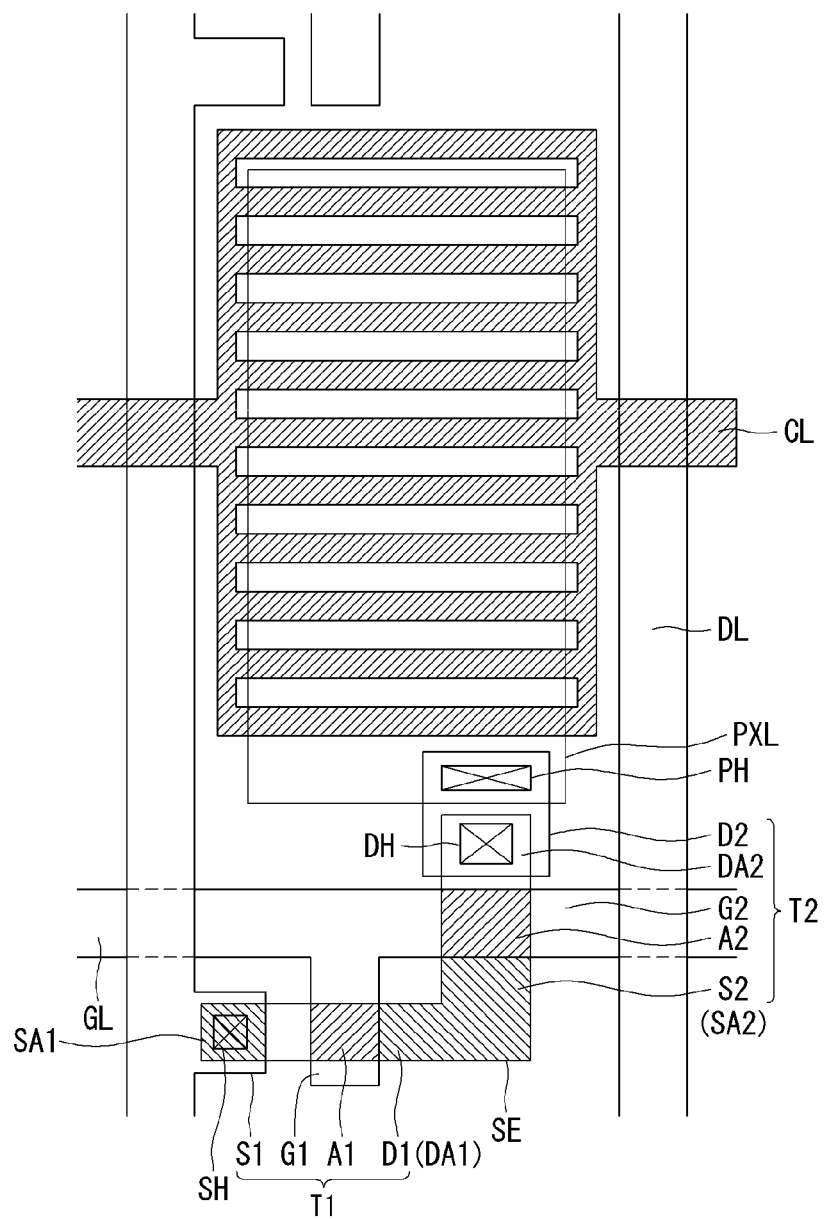
FIG. 3 is a plan view illustrating a thin film transistor substrate for a liquid crystal display including a compensation thin film transistor according to the related art.

Referring to attached figures, preferred embodiments of the present disclosure will be described. Like reference numerals designate like elements throughout the detailed description. However, the present disclosure is not restricted by these embodiments but can be applied to various changes or modifications without changing the technical spirit. In the following embodiments, the names of the elements are selected for ease of explanation and may be different from actual names.

First Embodiment

Figure 4:
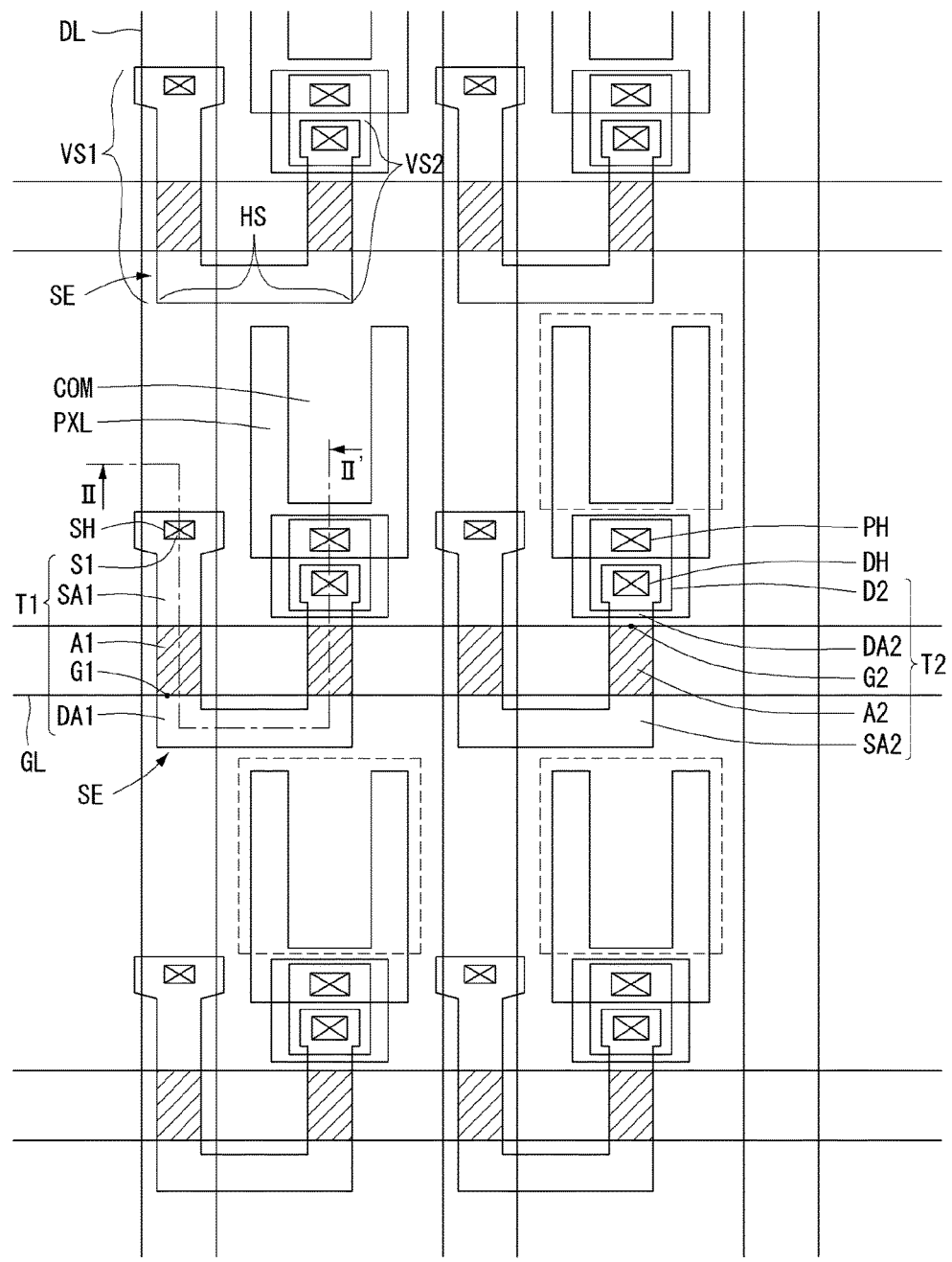
FIG. 4 is a plan view illustrating a thin film transistor substrate for a liquid crystal display having a compensation thin film transistor according to the first embodiment of the present disclosure.
Figure 5:
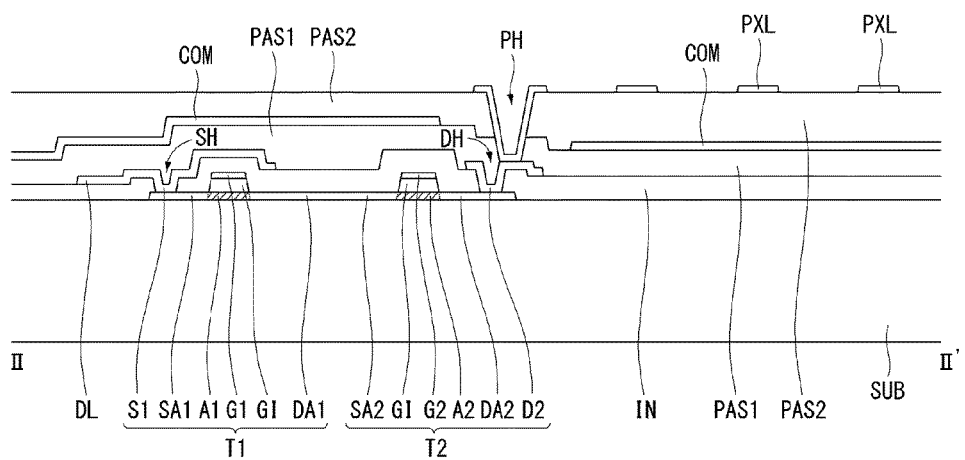
FIG. 5 is a cross sectional view illustrating the thin film transistor substrate for the display shown in FIG. 4 along to cutting line II-II'.

Hereinafter, referring to FIGS. 4 and 5, we will explain about the first embodiment of the present disclosure. FIG. 4 is a plan view illustrating a thin film transistor substrate for a liquid crystal display having a compensation thin film transistor according to the first embodiment of the present disclosure. FIG. 5 is a cross sectional view illustrating the thin film transistor substrate for the display shown in FIG. 4 along to cutting line II-II'. FIGS. 4 and 5 show a thin film transistor substrate for the ultra high density liquid crystal display over 400 PPI having a compensation thin film transistor.

The thin film transistor substrate according to the first embodiment of the present disclosure comprises a plurality of the pixel areas, on a substrate SUB, defined by a gate line GL and a data line DL crossing each other with an intermediate insulating layer IN there-between. Each pixel area includes a pixel electrode PXL and a common electrode COM overlapped each other with a second passivation layer PAS2 there-between for forming the fringe electric field. The common electrode COM may be formed as covering the most of the pixel area, and the pixel electrode PXL may be formed as including a plurality of segments (or fingers)

arrayed in parallel each other. For the high density thin film transistor substrate of 400 PPI, the pixel size is small such that the pixel electrode may have two or three segments.

Each pixel area has one driving thin film transistor T1. In addition, the pixel area includes one compensation thin film transistor T2 for compensating the Off-current feature of the driving thin film transistor T1. The drain electrode of the driving thin film transistor T1 is connected to the source electrode of the compensation thin film transistor T2.

We will explain in detail about the serial connection of the driving thin film transistor T1 and the compensation thin film transistor T2. On the substrate SUB, a plurality of the pixel areas are defined by the crossing structure of the gate lines GL running to the horizontal direction and the data line DL running to the vertical direction.

In the first embodiment, in order to increase the area ratio of the aperture area to the pixel area, the gate electrode is not formed as extruding from the gate line, but is formed using some portions of the gate line itself. That is, the thin film transistor is formed by overlapping the semiconductor layer SE with some portions of the gate line.

For example, the semiconductor layer SE has a first segment crossing the gate line GL and being parallel overlapped with the data line DL. The starting end of the semiconductor layer SE is contacting with the data line DL. Then, the overlapped portion of the first segment of the semiconductor layer SE with the gate line GL is defined as the first channel area A1 of the driving thin film transistor T1. The semiconductor layer SE has a second segment bending from the last end of the first segment to the next row pixel area as being parallel with the gate line GL. The semiconductor layer SE has a third segment bending from the last end of the second segment to the pixel area as crossing the gate line GL again as being parallel with the data line DL. Then, the overlapped portion of the third segment of the semiconductor layer SE with the gate line GL is defined as the second channel area A2 of the compensating thin film transistor T2.

More detail, the semiconductor layer SE is formed on the substrate SUB. The semiconductor layer SE includes a first vertical segment VS1 disposing as overlapped with some portion of the data line DL. The first vertical segment VS1 is crossing the gate line GL as starting from the upper row pixel area to the lower row pixel area based on the gate line GL. The semiconductor layer SE further includes a horizontal segment HS extended from the first vertical segment VS1 to the lower row pixel area. The semiconductor layer SE further includes a second vertical segment VS2 connected to the horizontal segment as being extended from the lower row pixel area to the upper row pixel area based on the gate line GL. The second vertical segment VS2 is crossing the gate line GL.

On the substrate SUB having the semiconductor layer SE, a gate insulating layer GI and a gate line GL are disposed by sequentially depositing a gate insulating material and a gate metal material and then patterning them. The gate line GL has two overlapped portions with the semiconductor layer SE per pixel area. These two overlapped portions of the gate line GL with the semiconductor layer SE are defined as a first gate electrode G1 and a second gate electrode G2, respectively. In detail, the overlapped portion of the gate line GL with the first vertical segment VS1 of the semiconductor layer SE is defined as the first gate electrode G1 of the driving thin film transistor T1. The overlapped portion of the gate line GL with the second vertical segment VS2 of the semiconductor layer SE is defined as the second gate electrode G2 of the compensation thin film transistor T2.

The semiconductor layer SE can be divided into two areas; one area is covered by (or overlapped with) the gate insulating layer GI and the gate line GL, the other area is exposed. The exposed area not covered by the gate line GL is conductorized by doping or injecting the impurity materials. As the results, the covered areas of the semiconductor layer SE by the gate line GL are defined as a channel areas A1 and A2. In detail, the overlapped portion of the semiconductor layer SE with the first gate electrode G1 is defined as the first channel area A1 of the driving thin film transistor T1. The overlapped portion of the semiconductor layer SE with the second gate electrode G2 is defined as the second channel area A2 of the compensation thin film transistor T2.

An intermediate insulating layer IN is deposited on the whole surface of the substrate SUB including the gate line GL having the gate electrodes G1 and G2. The conductorized (uncovered by the gate line GL) areas of the semiconductor layer SE are defined as source areas and drain areas. In detail, the starting portion of the first vertical segment VS1 located at the upper side from the first channel area A1 is defined as a first source area SA1 of the driving thin film transistor T1. The end portion of the first vertical segment VS1 located at the lower side from the first channel area A1 is defined as a first drain area DA1 of the driving thin film transistor T1. The starting portion of the second vertical segment VS2 located at the lower side from the second channel area A2 is defined as a second source area SA2 of the compensation thin film transistor T2. The end portion of the second vertical segment VS2 located at the upper side from the second channel area A2 is defined as a second drain area DA2 of the compensation thin film transistor T2. The horizontal segment HS includes, as the one body, the first drain area DA1 of the driving thin film transistor T1 and the second source area SA2 of the compensation thin film transistor T2.

The intermediate insulating layer IN has a source contact hole SH exposing some of the first source area SA1 of the driving thin film transistor T1 and a drain contact hole DH exposing some of the second drain area DA2 of the compensation thin film transistor T2. On the intermediate insulating layer IN, a data line DL made of a source-drain metal material is disposed as crossing with the gate line GL. In order to reduce the area of the non-aperture area, source electrodes are not formed separately, but some portions of the data line DL is used for the source electrodes. In detail, the contacting portion of the data line DL with the first vertical segment VS1 of the semiconductor layer SE via the source contact hole SH is the source electrode S1 of the driving thin film transistor T1. On the other hand, a drain electrode D2 is separately formed as contacting with second drain area DA2 of the compensation thin film transistor T2 via the drain contact hole DH. The drain electrode D2 is disposed lower portion of the pixel area.

A first passivation layer PAS1 is deposited on the whole surface of the substrate SUB as covering the driving thin film transistor T1 and the compensation thin film transistor T2. A common electrode COM is formed on the first passivation layer PAS1 as covering the whole surface of the substrate SUB. It is preferable that the common electrode COM covers most of all surface of the substrate SUB in order to minimize the surface resistance of the common electrode COM and to electrically shield the thin film transistors T1 and T2 and the lines. It is more preferable that the common electrode COM covers most of all surface of the substrate SUB except a pixel contact hole PH for connecting the drain electrode D2 of the compensation thin film transistor T2 to the pixel electrode PXL disposed over the common electrode COM.

A second passivation layer PAS2 is deposited on the common electrode COM as covering the whole surface of the substrate SUB. By patterning the second passivation layer PAS2 and the first passivation layer PAS1, the pixel contact hole PH exposing some of the drain electrode D2 of the compensation thin film transistor T2 is formed. It is preferable that the pixel contact hole PH is apart from the drain contact hole DH with a predetermined distance. The pixel electrode PXL connecting to the drain electrode D2 via the pixel contact hole PH is disposed on the second passivation layer PAS2. In order to form a fringe electric field between the common electrode COM and the pixel electrode PXL, it is preferable that the pixel electrode PXL includes a plurality of segments.

The thin film transistor substrate according to the first embodiment is applicable to the high density liquid crystal display having 300 to 400 PPI resolution. To get about 400 PPI resolution, the pixel area would be remarkably small. For example, the number of the segments for pixel electrode PXL would be 2 or 3 segments.

The structure of the thin film transistor substrate according to the first embodiment is applicable for the high density liquid crystal display by reducing the ratio of the non-display area to the pixel area. However, there is a restriction to apply the structure of the first embodiment to the ultra high density liquid crystal display having 500 PPI or more and including the compensation thin film transistor serially connected to the driving thin film transistor. That is, a new structure suitable for the ultra high density liquid crystal display having 500 to 800 PPI resolution is required. Hereinafter, we provide a thin film transistor substrate in which the non-aperture area ratio to the pixel area is minimized to establish the ultra high density liquid crystal display having 500 to 800 PPI resolution.

Second Embodiment

Figure 6:
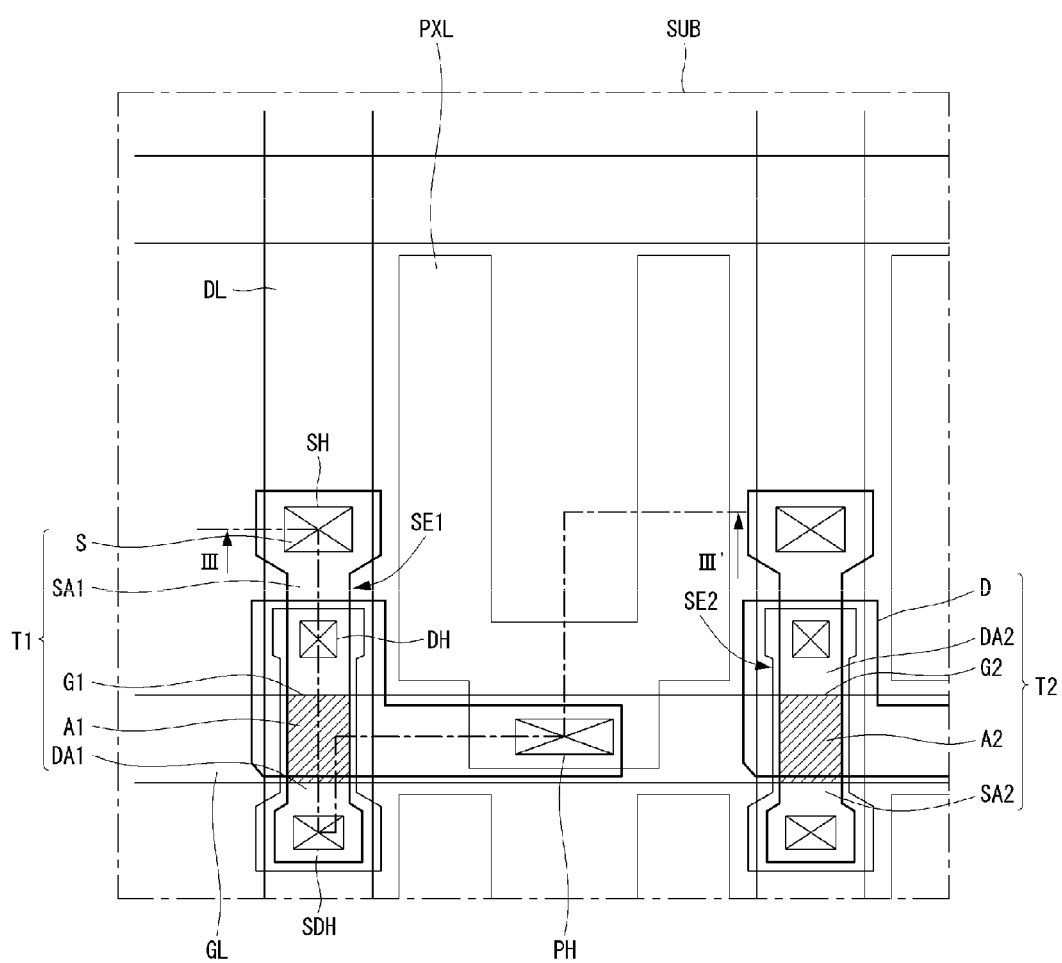
FIG. 6 is a plan view illustrating a thin film transistor substrate for a liquid crystal display having a compensation thin film transistor according to the second embodiment of the present disclosure.
Figure 7:
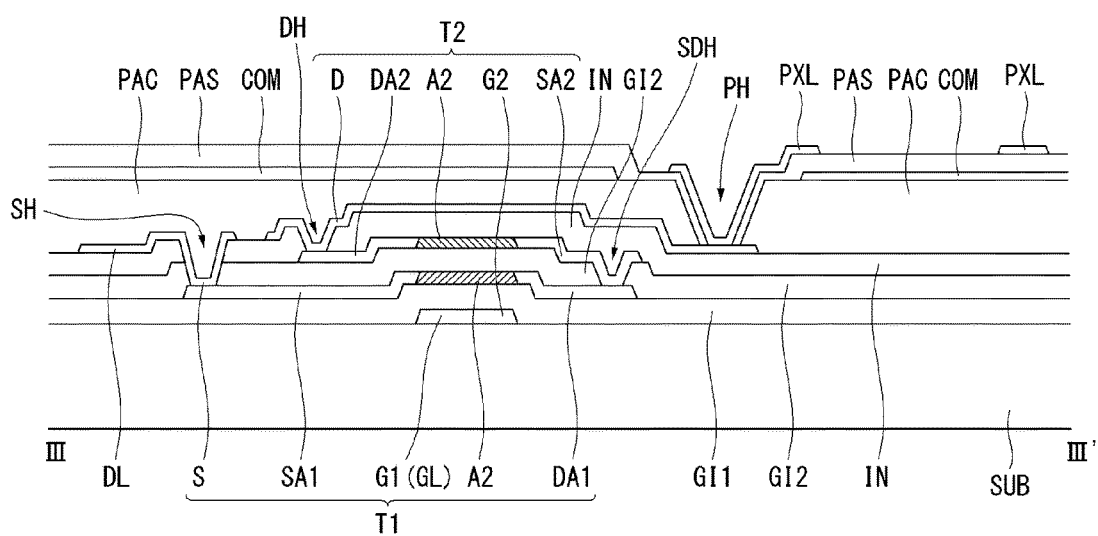
FIG. 7 is a cross sectional view illustrating the thin film transistor substrate for the display shown in FIG. 6 along to cutting line III-III'.

Hereinafter, referring to FIGS. 6 and 7, we will explain about the second embodiment of the present disclosure. FIG. 6 is a plan view illustrating a thin film transistor substrate for a liquid crystal display having a compensation thin film transistor according to the second embodiment of the present disclosure. FIG. 7 is a cross sectional view illustrating the thin film transistor substrate for the display shown in FIG. 6 along to cutting line III-III'.

Referring to FIG. 6, the thin film transistor substrate according to the second embodiment of the present disclosure comprises a gate line GL and a data line DL disposed on a substrate SUB. The gate line GL is running to a horizontal (first) direction on the substrate SUB. The data line DL is running to a vertical (second) direction on the substrate SUB.

A plurality of pixel areas are defined in a matrix manner by the crossing structure of a plurality of the data lines DL and a plurality of the gate lines GL. Each pixel area includes a first thin film transistor T1, a second thin film transistor T2 and a pixel electrode PXL. Here, any one of the first and the second thin film transistors T1 and T2 is the driving thin film transistor for driving the pixel electrode PXL and the other is the compensation thin film transistor for compensating the driving thin film transistor.

Along to one data line DL, the first thin film transistor T1 and the second thin film transistor T2 are disposed where the gate line GL is crossing with the data line DL. In detail, the first thin film transistor T1 includes a first semiconductor layer SE1 having a segment shape crossing the gate line GL. The second thin film transistor T2 includes a second semiconductor layer SE2 having a segment shape crossing the gate line GL. The first semiconductor layer SE1 and the second semiconductor layer SE2 are overlapped each other.

More detail, the first semiconductor layer SE1 has the vertical segment overlapped and parallel with the data line DL. The first semiconductor layer SE1 has the segment which is starting from the upper position of the gate line GL, crossing the gate line GL and ending to the lower position of the gate line GL. The starting end located upper from the gate line GL is connected to the data line DL.

The overlapped portion of the first semiconductor layer SE1 with the gate line GL is defined as a first channel area A1. The overlapped portion of the gate line GL with the first channel area A1 is defined as a first gate electrode G1. The upper portion of the first semiconductor layer SE1 extended from the first channel area A1 to the upper area of the gate line GL is defined as a first source area SA1. The portion of the data line DL contacting with the first source area SA1 is defined as a source electrode S. That is, the source electrode S is not extruded from the data line DL, but some of the data line DL act as the source electrode S. The lower portion of the first semiconductor layer SE1 extended from the first channel area A1 to the lower area of the gate line GL is defined as a first drain area DA1. The first thin film transistor T1 includes the source electrode S, the first source area SA1, the first channel area A1, the first gate electrode G1 and the first drain area DA1.

The second semiconductor layer SE2 also has the vertical segment overlapped and parallel with the data line DL. The second semiconductor layer SE2 has the segment which is starting from the lower position of the gate line GL, crossing the gate line GL and ending to the upper position of the gate line GL.

The overlapped area of the second semiconductor layer SE2 with the gate line GL is defined as a second channel area A2. The overlapped area of the gate line GL with the second channel area A2 is defined as a second gate electrode G2. The extended area of the second semiconductor layer SE2 from the second channel area A2 to the lower area of the gate line GL is defined as a second source area SA2. The extended area of the second semiconductor layer SE2 from the second channel area A2 to the upper area of the gate line GL is defined as a second drain area DA2. The drain electrode D is connected with the second drain area DA2. The second thin film transistor T2 includes the second source area SA2, the second channel area A2, the second gate electrode G2, the second drain area DA2 and the drain electrode D.

The drain electrode D may have the 1' shape as being overlapped with the data line DL and the gate line GL. AS the drain electrode D is overlapped with the data line DL and the gate line GL, it is ensured that the aperture area has the maximum area ratio in the pixel area.

At the pixel area, the drain electrode D and the pixel electrode PXL are disposed. For example, the pixel electrode PXL may include a plurality of segments disposed in parallel each other. Not shown in the plan view, the common electrode is deposited on the substrate SUB as covering the whole surface of the substrate SUB. In that case, the common electrode COM may be disposed under the pixel area PXL. Otherwise, the common electrode COM may include a plurality of segments disposed in parallel each other. In this case, the pixel electrode PXL may be disposed under the common electrode COM as having a rectangular shape corresponding to the pixel area.

Referring to FIG. 7, we will explain about the cross sectional structure of the thin film transistor substrate for the liquid crystal display according to the second embodiment of the present disclosure. The first gate electrode G1 is disposed on the substrate SUB. The first gate electrode G1 is not extruded from the gate line GL, but some portion of the gate line GL is the first gate electrode G1. The first gate electrode G1 is also used as the second gate electrode G2. That is, the first gate electrode G1 and the second gate electrode are defined as the same portion of the gate line GL.

The first gate insulating layer GI1 is deposited on the first gate electrode G1 as covering the whole surface of the substrate SUB. On the first gate insulating layer GI1, the first semiconductor layer SE1 is disposed. The first semiconductor layer SE1 has the segment shape crossing the first gate electrode G1. The overlapped portion of the first semiconductor layer SE1 with the first gate electrode G1 is defined as the first channel area A1. One side portions extended from the first channel area A1 is defined as the first source area SA1 and the other side portions extended from the first channel area A1 is defined as the first drain area DA1.

The second gate insulating layer GI2 is deposited on the first semiconductor layer SE1 as covering the whole surface of the substrate SUB. The second gate insulating layer GI2 has a source-drain contact hole SDH for exposing some of the first drain area DA1. The second semiconductor layer SE2 is disposed on the second gate insulating layer GI2. The second semiconductor layer SE2 has the segment shape crossing the second gate electrode G2. Here, the second gate electrode G2 is the first gate electrode G1.

That is, the same gate electrode acts as the gate element to the first semiconductor layer SE1 and the second semiconductor layer SE2. The overlapped portion of the second semiconductor layer SE2 with the second gate electrode G2 is defined as the second channel area A2. One side portion extended from the second channel area A2 is defined as the second source area SA2, and the other side portion extended from the second channel area A2 is defined as the second drain area DA2. The second source area SA2 contacts the first drain area DA1 via the source-drain contact hole SDH.

The intermediate insulating layer IN is deposited on the second semiconductor layer SE2 as covering the whole surface of the substrate SUB. The intermediate insulating layer IN has the drain contact hole DH for exposing some of the second drain area DA2. Further, the source contact hole SH is formed by penetrating the intermediate insulating layer IN and the second gate insulating layer GI2, for exposing some of the first source area SA1.

On the intermediate insulating layer IN, the data line DL and the drain electrode D are formed. The data line DL contacts the first source area SA1 via the source contact hole SH. The contact portion of the data line DL with the first source area SA1 is defined as the source electrode S. The drain electrode D contacts the second drain area DA2 via the drain contact hole DH. That is, the first thin film transistor T1 is connected to the second thin film transistor T2 in series. Further, as the first and second thin film transistors T1 and T2 are vertically overlapped with the second gate insulating layer GI2 there-between in the cross sectional view, they are disposed within same area in the plan view.

The planar layer PAC is deposited on the data line DL and the drain electrode D as covering the whole surface of the substrate SUB. The planar layer PAC may include an organic material. Otherwise, the planar layer PAC may include an inorganic layer having the inorganic material and an organic layer having the organic material sequentially stacked. The pixel contact hole PH exposing some of the drain electrode D is formed at the planar layer PAC.

On the planar layer PAC, the common electrode COM is formed. The common electrode COM may have a sheet shape covering the most all surface of the substrate SUB except the pixel contact hole PH. On the common electrode COM, a passivation layer PAS is deposited as covering the whole surface of the substrate SUB. The passivation layer has the pixel contact hole PH. That is the pixel contact hole PH is formed by penetrating the planar layer PAC and the passivation layer PAS at the same position.

On the passivation layer PAS, the pixel electrode PXL is formed. The pixel electrode PXL contacts the drain electrode D via the pixel contact hole PH. The pixel electrode PXL has a plurality of segments overlapped with the common electrode COM within the pixel area. Between the pixel electrode PXL and the common electrode COM, the fringe electric field is formed for driving the liquid crystal material.

The thin film transistor substrate for the liquid crystal display according to the second embodiment includes two thin film transistors. As including the thin film transistor for driving the pixel electrode and the compensation thin film transistor for compensating the elements, superior performance can be acquired. As stacking these two thin film transistors vertically, the area for the thin film transistors can be minimized within the pixel area. Further, the thin film transistors are disposed as overlapped with the data line, so that the area for the thin film transistor can be minimized within the pixel area. Therefore, the aperture ratio can be maximized. Especially, for the ultra high density liquid crystal display having about 800 PPI resolution, the pixel area is extremely small. As the thin film transistors are disposed within the extremely small pixel area, the aperture ratio would have low value. However, according to the second embodiment, as the thin film transistors are disposed as overlapping with the data line, the aperture ratio can have the maximum value.

Third Embodiment

Figure 8:
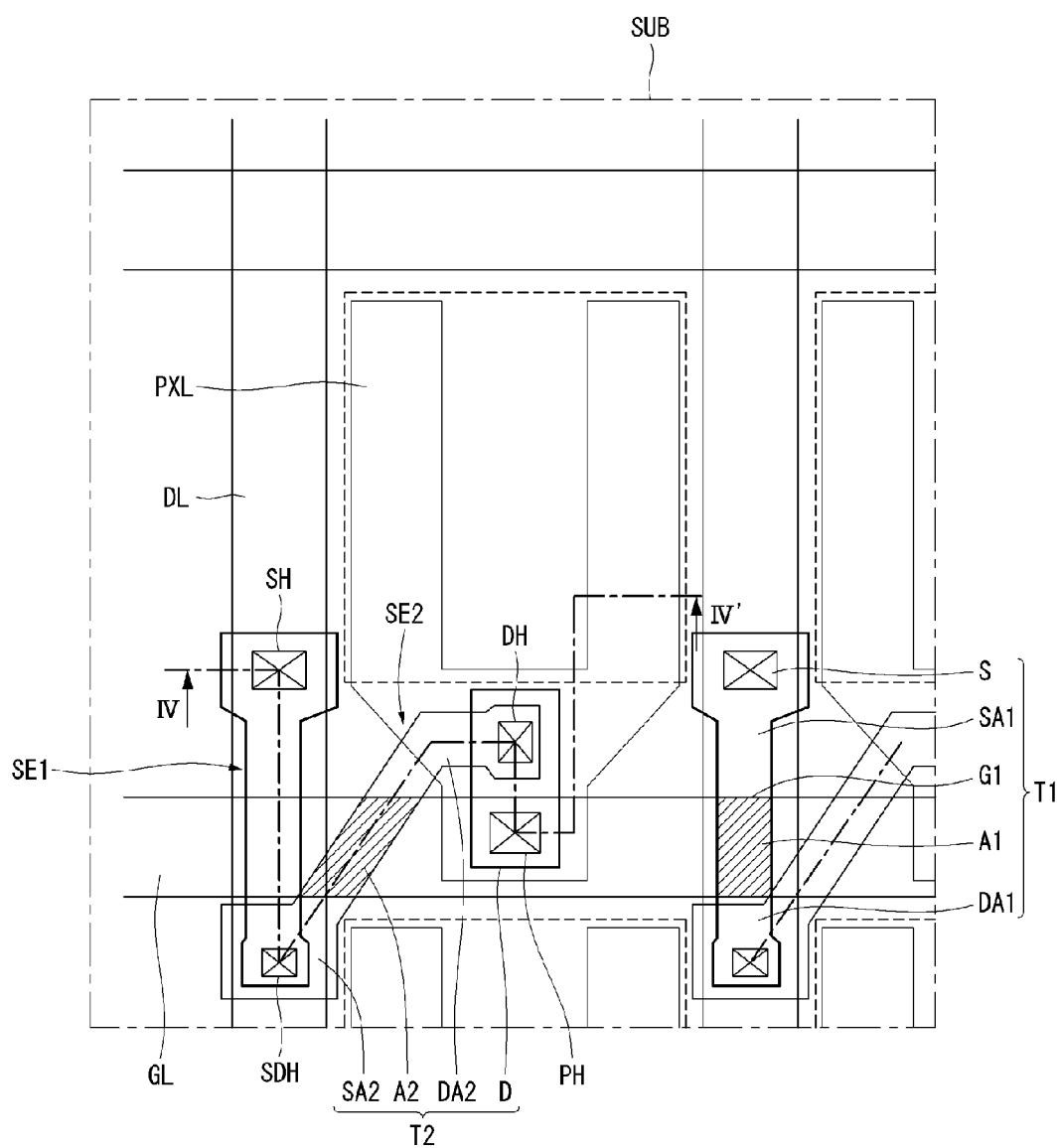
FIG. 8 is a plan view illustrating a thin film transistor substrate for a liquid crystal display having a compensation thin film transistor according to the third embodiment of the present disclosure.
Figure 9:
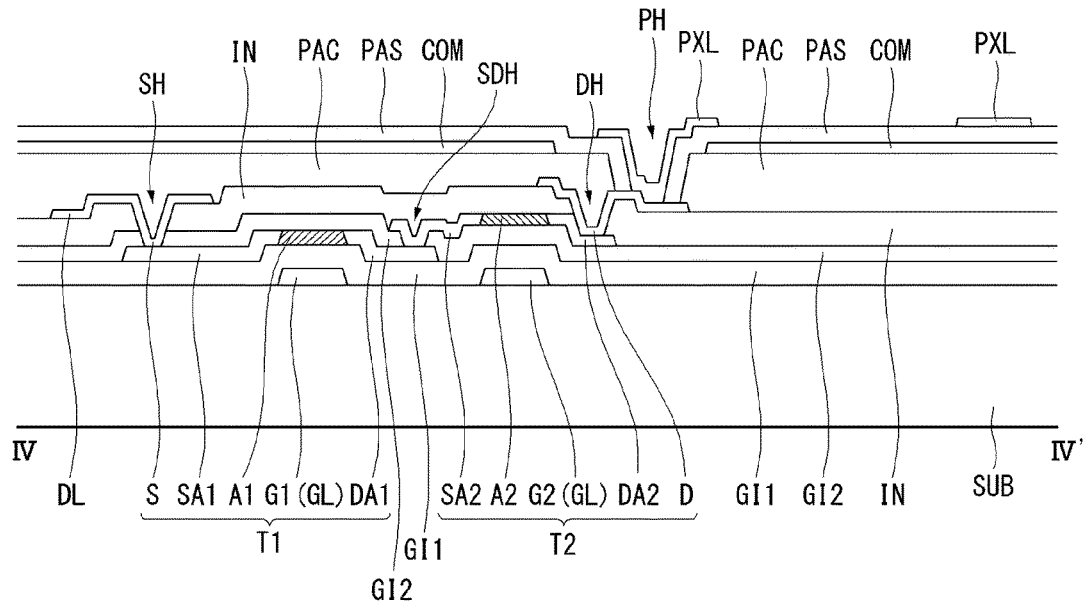
FIG. 9 is a cross sectional view illustrating the thin film transistor substrate for the display shown in FIG. 8 along to cutting line IV-IV'.

Hereinafter, referring to FIGS. 8 and 9, we will explain about the third embodiment of the present disclosure. FIG. 8 is a plan view illustrating a thin film transistor substrate for a liquid crystal display having a compensation thin film transistor according to the third embodiment of the present disclosure. FIG. 9 is a cross sectional view illustrating the thin film transistor substrate for the display shown in FIG. 8 along to cutting line IV-IV'.

Referring to FIG. 8, the thin film transistor substrate according to the third embodiment comprises a gate line GL and a data line DL disposed on a substrate SUB. The gate line GL is running to a horizontal (first) direction on the substrate SUB. The data line DL is running to a vertical (second) direction on the substrate SUB.

A plurality of pixel areas are defined in a matrix manner by the crossing structure of a plurality of the data lines DL and a plurality of the gate lines GL. Each pixel area includes a first thin film transistor T1, a second thin film transistor T2 and a pixel electrode PXL. Here, any one of the first and the second thin film transistors T1 and T2 is the driving thin film transistor for driving the pixel electrode PXL and the other is the compensation thin film transistor for compensating the driving thin film transistor.

Along to one data line DL, the first thin film transistor T1 and the second thin film transistor T2 are disposed where the gate line GL is crossing with the data line DL. In detail, the first thin film transistor T1 includes a first semiconductor layer SE1 having a segment shape crossing the gate line GL. The second thin film transistor T2 includes a second semiconductor layer SE2 having a segment shape crossing the gate line GL. The first semiconductor layer SE1 and the second semiconductor layer SE2 may form a 'V' shape as being not overlapped each other.

More detail, the first semiconductor layer SE1 has the vertical segment overlapped and parallel with the data line DL. The first semiconductor layer SE1 has the segment which is starting from the upper position of the gate line GL, crossing the gate line GL and ending to the lower position of the gate line GL. The starting end located upper from the gate line GL is connected to the data line DL.

The overlapped portion of the first semiconductor layer SE1 with the gate line GL is defined as a first channel area A1. The overlapped portion of the gate line GL with the first channel area A1 is defined as a first gate electrode G1. The upper portion of the first semiconductor layer SE1 extended from the first channel area A1 to the upper area of the gate line GL is defined as a first source area SA1. The portion of the data line DL contacting with the first source area SA1 is defined as a source electrode S. That is, the source electrode S is not extruded from the data line DL, but some of the data line DL act as the source electrode S. The lower portion of the first semiconductor layer SE1 extended from the first channel area A1 to the lower area of the gate line GL is defined as a first drain area DA1. The first drain area DA1 is facing the first source area SA1 based on the first channel area A1. The first thin film transistor T1 includes the source electrode S, the first source area SA1, the first channel area A1, the first gate electrode G1 and the first drain area DA1.

The second semiconductor layer SE2 has a slanted segment extended from the data line DL to the pixel area. In detail, the second semiconductor layer SE2 has the slanted segment which is starting from the lower position of the gate line GL, crossing the gate line GL and ending inside of the pixel area located the upper position of the gate line GL. The second semiconductor layer SE2 has a slanted segment for detouring around the first semiconductor layer SE1 so that the second channel area A2 is not overlapped with the first channel area A1.

The overlapped area of the second semiconductor layer SE2 with the gate line GL is defined as a second channel area A2. The overlapped area of the gate line GL with the second channel area A2 is defined as a second gate electrode G2. The extended area of the second semiconductor layer SE2 from the second channel area A2 to the lower area of the gate line GL is defined as a second source area SA2. The extended area of the second semiconductor layer SE2 from the second channel area A2 to the upper area of the gate line GL is defined as a second drain area DA2. The second drain area DA2 is connected with the second drain area DA2. The second thin film transistor T2 includes the second source area SA2, the second channel area A2, the second gate electrode G2, the second drain area DA2 and the drain electrode D.

The drain electrode D may have a rectangular shape extended from the pixel area to the gate line GL so that one end portion is overlapped with the gate line GL. As the drain electrode D is overlapped with the gate line GL, it is ensured that the aperture area has the maximum area ratio in the pixel area.

At the pixel area, the drain electrode D and the pixel electrode PXL are disposed. For example, the pixel electrode PXL may include a plurality of segments disposed in parallel each other. Not shown in the plan view, the common electrode is deposited on the substrate SUB as covering the whole surface of the substrate SUB. In that case, the common electrode COM may be disposed under the pixel area PXL. Otherwise, the common electrode COM may include a plurality of segments disposed in parallel each other. In this case, the pixel electrode PXL may be disposed under the common electrode COM as having a rectangular shape corresponding to the pixel area.

Referring to FIG. 9, we will explain about the cross sectional structure of the thin film transistor substrate for the liquid crystal display according to the third embodiment of the present disclosure. The first gate electrode G1 and the second gate electrode G2 are disposed on the substrate SUB. The first gate electrode G1 and the second gate electrode G2 are not extruded from the gate line GL, but some portions of the gate line GL are the first and the second gate electrodes G1 and G2, respectively.

The first gate insulating layer GI1 is deposited on the first gate electrode G1 and the second gate electrode G2 as covering the whole surface of the substrate SUB. On the first gate insulating layer GI1, the first semiconductor layer SE1 is disposed. The first semiconductor layer SE1 has the segment shape crossing the first gate electrode G1. The overlapped portion of the first semiconductor layer SE1 with the first gate electrode G1 is defined as the first channel area A1. One side portions extended from the first channel area A1 is defined as the first source area SA1 and the other side portions extended from the first channel area A1 is defined as the first drain area DA1.

The second gate insulating layer GI2 is deposited on the first semiconductor layer SE1 as covering the whole surface of the substrate SUB. The second gate insulating layer GI2 has a source-drain contact hole SDH for exposing some of the first drain area DA1. The second semiconductor layer SE2 is disposed on the second gate insulating layer GI2. The second semiconductor layer SE2 has the slanted segment shape crossing the second gate electrode G2. The overlapped portion of the second semiconductor layer SE2 with the second gate electrode G2 is defined as the second channel area A2. One side portion extended from the second channel area A2 is defined as the second source area SA2, and the other side portion extended from the second channel area A2 is defined as the second drain area DA2. The second source area SA2 contacts the first drain area DA1 via the source-drain contact hole SDH.

The intermediate insulating layer IN is deposited on the second semiconductor layer SE2 as covering the whole surface of the substrate SUB. The intermediate insulating layer IN has the drain contact hole DH for exposing some of the second drain area DA2. Further, the source contact hole SH is formed by penetrating the intermediate insulating layer IN and the second gate insulating layer GI2, for exposing some of the first source area SA1.

On the intermediate insulating layer IN, the data line DL and the drain electrode D are formed. The data line DL contacts the first source area SA1 via the source contact hole SH. The contact portion of the data line DL with the first source area SA1 is defined as the source electrode S. The drain electrode D contacts the second drain area DA2 via the drain contact hole DH. That is, the first thin film transistor T1 is connected to the second thin film transistor T2 in series.

The planar layer PAC is deposited on the data line DL and the drain electrode D as covering the whole surface of the substrate SUB. The planar layer PAC may include an organic material. Otherwise, the planar layer PAC may include an inorganic layer having the inorganic material and an organic layer having the organic material sequentially stacked. The pixel contact hole PH exposing some of the drain electrode D is formed at the planar layer PAC.

On the planar layer PAC, the common electrode COM is formed. The common electrode COM may have a sheet shape covering the most all surface of the substrate SUB except the pixel contact hole PH. On the common electrode COM, a passivation layer PAS is deposited as covering the whole surface of the substrate SUB. The passivation layer has the pixel contact hole PH. That is the pixel contact hole PH is formed by penetrating the planar layer PAC and the passivation layer PAS at the same position.

On the passivation layer PAS, the pixel electrode PXL is formed. The pixel electrode PXL contacts the drain electrode D via the pixel contact hole PH. The pixel electrode PXL has a plurality of segments overlapped with the common electrode COM within the pixel area. Between the pixel electrode PXL and the common electrode COM, the fringe electric field is formed for driving the liquid crystal material.

The thin film transistor substrate for the liquid crystal display according to the second embodiment includes two thin film transistors. As including the thin film transistor for driving the pixel electrode and the compensation thin film transistor for compensating the elements, superior performance can be acquired.

In the third embodiment, two thin film transistors are vertically stacked but they are not overlapped. Comparing with the second embodiment, the area for the thin film transistors would be little larger so that the aperture ratio is lower than the second embodiment little bit. However, in the second embodiment, as the two channel areas A1 and A2 are overlapped with the same gate line, the large amount of parasitic capacitance would be formed. In the third embodiment, as the first channel area A1 and the second channel area A2 are not overlapped, the parasitic storage would not be formed or reduced so that the much better performance of thin film transistors can be acquired.

According to the third embodiment, the characteristics of the thin film transistors can be stable and the high aperture ratio can be acquired by reducing the non-aperture area in the pixel area. Especially, for the ultra high density liquid crystal display having about 800 PPI resolution, the superior performance and high aperture ratio can be simultaneously acquired.

Fourth Embodiment

In the above descriptions, we explained about the bottom gate structure of the thin film transistors. Further, we explained about that the first gate electrode G1 of the first thin film transistor T1 and the second gate electrode G2 of the second thin film transistor T2 are defined as some portions of the same gate line GL. Hereinafter, we will explain about other cases. These structural features may be exactly distinguished on the cross sectional views not on the plan views. Therefore, in convenience, we would use FIG. 6 and/or FIG. 8 for the plan view. The cases that we will explain hereinafter can be also applied to the second and the third embodiments.

Figure 10:
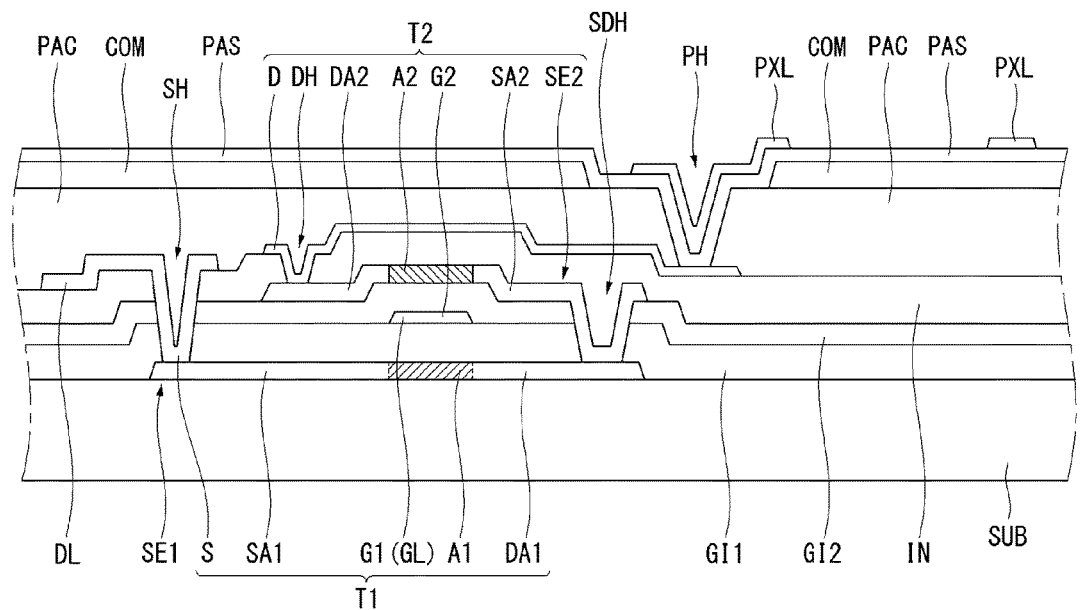
FIG. 10 is a cross sectional view illustrating a thin film transistor substrate for a liquid crystal display having a compensation thin film transistor according to the fourth embodiment of the present disclosure.

Referring to FIG. 10, we will explain about the fourth embodiment of the present disclosure. FIG. 10 is a cross sectional view illustrating a thin film transistor substrate for a liquid crystal display having a compensation thin film transistor according to the fourth embodiment of the present disclosure.

Referring to FIG. 10, the first semiconductor layer SE1 is formed on the substrate SUB. On the first semiconductor layer SE1, the first gate insulating layer GI1 is deposited as covering the whole surface of the substrate SUB. On the first gate insulating layer GI1, the first gate electrode G1 is formed. The first gate electrode G1 is not extruded from the gate line GL, but some portions of the gate line GL become the first gate electrode G1. The first gate electrode G1 would be used as the second gate electrode G2. That is, the same portion of the gate line GL would be the first gate electrode G1 and the second gate electrode G2.

The first semiconductor layer SE1 has the segment shape crossing the first gate electrode G1. The overlapped portion of the first semiconductor layer SE1 with the gate line GL is defined as a first channel area A1. One side portion of the first semiconductor layer SE1 extended from the first channel area A1 is defined as the first source area SA1. The other side portion of the first semiconductor layer SE1 extended from the first channel area A1 is defined as the first drain area DA1.

On the first gate electrode G1 and the second gate electrode G2, the second gate insulating layer GI2 is deposited as covering the whole surface of the substrate SUB. The source-drain contact hole SDH is formed for exposing some of the first drain area DA1 by penetrating the second gate insulating layer GI2 and the first gate insulating layer GI1. The second semiconductor layer SE2 is formed on the second gate insulating layer GI2. The second semiconductor layer SE2 has the segment crossing the first gate electrode G1 and the second gate electrode G2.

The same gate electrode performs the gate function to the first semiconductor layer SE1 and the second semiconductor layer SE2. The overlapped portion of the second semiconductor layer SE2 with the second gate electrode G2 is defined as the second channel area A2. One side portion of the second semiconductor layer SE2 extended from the second channel area A2 is defined as the second source area SA2. The other side portion of the second semiconductor layer SE2 extended from the second channel area A2 is defined as the second drain area DA2. The second source area SA2 contacts the first drain area DA1 via the source-drain contact hole SDH.

On the second semiconductor layer SE2, the intermediate insulating layer IN is deposited as covering the whole surface of the substrate SUB. By penetrating the intermediate insulating layer IN, the drain contact hole DH is formed as exposing some of the second drain area DA2. Further, by penetrating the intermediate insulating layer IN, the second gate insulating layer GI2 and the first gate insulating layer GI1, the source contact hole SH is formed as exposing some of the first source area SA1.

On the intermediate insulating layer IN, the data line DL and the drain electrode D is formed. The data line DL contacts the first source area SA1 via the source contact hole SH. The contacting area of the data line DL with the first source area SA1 is defined as the source electrode S. The drain electrode D contacts the second drain area DA2 via the drain contact hole DH. The second thin film transistor T2 is connected to the first thin film transistor T1 in series. The first thin film transistor T1 and the second thin film transistor T2 are vertically stacked with the second gate insulating layer GI2 and/or the first gate insulating layer GI1 therebetween. Therefore, the two thin film transistors are disposed within the area corresponding to the area for one thin film transistor.

On the data line DL and the drain electrode D, the planar layer PAC is deposited as covering the whole surface of the substrate SUB. The planar layer PAC may include an organic material. Otherwise, the planar layer PAC may include an inorganic layer having the inorganic material and an organic layer having the organic material sequentially stacked. The pixel contact hole PH exposing some of the drain electrode D is formed at the planar layer PAC.

On the planar layer PAC, the common electrode COM is formed. The common electrode COM may have a sheet shape covering the most all surface of the substrate SUB except the pixel contact hole PH. On the common electrode COM, a passivation layer PAS is deposited as covering the whole surface of the substrate SUB. The passivation layer has the pixel contact hole PH. That is the pixel contact hole PH is formed by penetrating the planar layer PAC and the passivation layer PAS at the same position.

On the passivation layer PAS, the pixel electrode PXL is formed. The pixel electrode PXL contacts the drain electrode D via the pixel contact hole PH. The pixel electrode PXL has a plurality of segments overlapped with the common electrode COM within the pixel area. Between the pixel electrode PXL and the common electrode COM, the fringe electric field is formed for driving the liquid crystal material.

In the fourth embodiment, we provide a structure in which the gate line GL is inserted between the first semiconductor layer SE1 and the second semiconductor layer SE2 in cross sectional view. As the results, the first thin film transistor T1 has the top gate structure, and the second thin film transistor T2 has the bottom gate structure.

Fifth Embodiment

Figure 11:
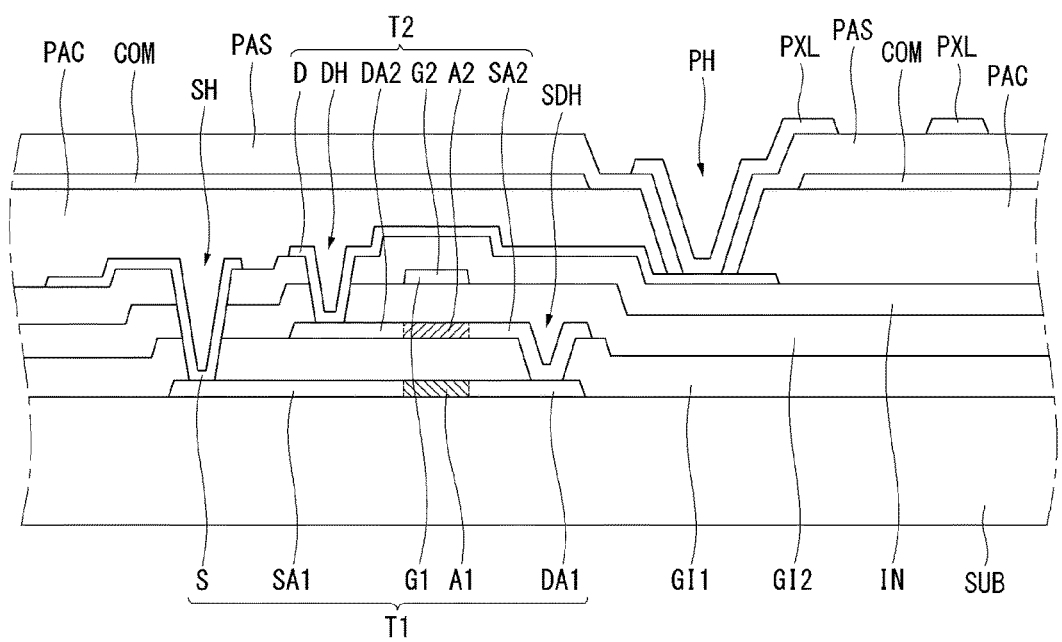
FIG. 11 is a cross sectional view illustrating a thin film transistor substrate for a liquid crystal display having a compensation thin film transistor according to the fifth embodiment of the present disclosure.

Referring to FIG. 11, we will explain about the fifth embodiment of the present disclosure. FIG. 11 is a cross sectional view illustrating a thin film transistor substrate for a liquid crystal display having a compensation thin film transistor according to the fifth embodiment of the present disclosure.

Referring to FIG. 11, the first semiconductor layer SE1 is formed on the substrate SUB. On the first semiconductor layer SE1, the first gate insulating layer GI1 is deposited as covering the whole surface of the substrate SUB. The first gate insulating layer GI1 has the source-drain contact hole SDH for exposing some of the first semiconductor layer SE1.

On the first gate insulating layer GI1, the second semiconductor layer SE2 is formed. The second semiconductor layer SE2 contact the first semiconductor layer SE1 via the source-drain contact hole SDH. On the second semiconductor layer SE2, the second gate insulating layer GI2 is deposited as covering the whole surface of the substrate SUB.

On the second gate insulating layer GI2, the gate line GL is formed. The gate line GL is crossing with the first semiconductor layer SE1 and the second semiconductor layer SE2, as explained in the second embodiment (FIG. 6) or in the third embodiment (FIG. 8). The overlapped portion of the gate line GL with the first semiconductor layer SE1 is defined as the first gate electrode G1. The overlapped portion of the gate line GL with the second semiconductor layer SE2 is defined as the second gate electrode G2.

The first gate electrode G1 and the second gate electrode G2 are not extruded from the gate line GL, but some of the gate line GL are to be the first gate electrode G1 and the second gate electrode G2. When the same portion of the gate line GL may be overlapped with the first semiconductor layer SE1 and the second semiconductor layer SE2, then the first gate electrode G1 is the same with the second gate electrode G2. Otherwise, two portions of the gate line GL may be overlapped with the first semiconductor layer SE1 and the second semiconductor layer SE2, respectively.

The overlapped portion of the first semiconductor layer SE1 with the first gate electrode G1 is defined as the first channel area A1. One side portions extended from the first channel area A1 is defined as the first source area SA1 and the other side portions extended from the first channel area A1 is defined as the first drain area DA1. The overlapped portion of the second semiconductor layer SE2 with the second gate electrode G2 is defined as the second channel area A2. One side portions extended from the second channel area A2 is defined as the second source area SA2 and the other side portions extended from the second channel area A2 is defined as the second drain area DA2. The second source area SA2 contacts the first drain area DA1 via the source-drain contact hole.

On the gate line GL including the first gate electrode G1 and the second gate electrode G2, the intermediate insulating layer IN is deposited as covering the whole surface of the substrate SUB. The drain contact hole DH exposing some of the second drain area DA2 is formed by penetrating the intermediate insulating layer IN. Further, by penetrating the intermediate insulating layer IN, the second gate insulating layer GI2 and the first gate insulating layer GI1, the source contact hole SH is formed as exposing some of the first source area SA1.

On the intermediate insulating layer IN, the data line DL and the drain electrode D is formed. The data line DL contacts the first source area SA1 via the source contact hole SH. The contacting area of the data line DL with the first source area SA1 is defined as the source electrode S. The drain electrode D contacts the second drain area DA2 via the drain contact hole DH. The second thin film transistor T2 is connected to the first thin film transistor T1 in series. The first thin film transistor T1 and the second thin film transistor T2 are vertically stacked with the first gate insulating layer GI1 there-between. Therefore, the two thin film transistors are disposed within the area corresponding to the area for one thin film transistor.

On the data line DL and the drain electrode D, the planar layer PAC is deposited as covering the whole surface of the substrate SUB. The planar layer PAC may include an organic material. Otherwise, the planar layer PAC may include an inorganic layer having the inorganic material and an organic layer having the organic material sequentially stacked. The pixel contact hole PH exposing some of the drain electrode D is formed at the planar layer PAC.

On the planar layer PAC, the common electrode COM is formed. The common electrode COM may have a sheet shape covering the most all surface of the substrate SUB except the pixel contact hole PH. On the common electrode COM, a passivation layer PAS is deposited as covering the whole surface of the substrate SUB. The passivation layer has the pixel contact hole PH. That is the pixel contact hole PH is formed by penetrating the planar layer PAC and the passivation layer PAS at the same position.

On the passivation layer PAS, the pixel electrode PXL is formed. The pixel electrode PXL contacts the drain electrode D via the pixel contact hole PH. The pixel electrode PXL has a plurality of segments overlapped with the common electrode COM within the pixel area. Between the pixel electrode PXL and the common electrode COM, the fringe electric field is formed for driving the liquid crystal material.

In the fifth embodiment, the gate line GL is disposed over the first semiconductor layer SE1 and the second semiconductor layer SE2. As the results, the first thin film transistor T1 and the second thin film transistor T2 have the top gate structure.

In the above descriptions, the gate electrode is one portion of the gate line. Moreover, the first gate electrode and the second gate electrode are some portions of the gate line. Even though it is not shown in figures, if required, any one of the first gate electrode and the second gate electrode may be defined as one portion of the gate line, but the other may be formed as extrude from the gate line. For example, the first gate electrode may be one portion of the gate line and disposed under the first semiconductor layer. Further, the second gate electrode may be formed extruded from the gate line and disposed on the second semiconductor layer. Otherwise, the second gate electrode may be formed another layer and then connected to the gate line through another contact hole.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A liquid crystal display, comprising:
    a gate line on a substrate;
    a first gate insulating layer on the gate line;
    a first semiconductor layer crossing the gate line on the first gate insulating layer;
    a second gate insulating layer on the first semiconductor layer;
    a second semiconductor layer crossing the gate line on the second gate insulating layer;
    an intermediate insulating layer on the second semiconductor layer;
    a data line connected to the first semiconductor layer on the intermediate insulating layer; and
    a drain electrode connected to the second semiconductor layer on the intermediate insulating layer.

2. The liquid crystal display according to the claim 1, further comprising:
    a planar layer on the data line and the drain electrode;
    a common electrode on the planar layer;
    a passivation layer on the common electrode; and
    a pixel electrode connected to the drain electrode on the passivation layer.

3. The liquid crystal display according to the claim 1, wherein the first semiconductor layer includes:
    a first source area connected to the data line;
    a first channel area overlapped with the gate line; and
    a first drain area facing the first source area based on the first channel area.

4. The liquid crystal display according to the claim 3, wherein the second semiconductor layer includes:
    a second source area connected to the first drain area;
    a second channel area overlapped with the gate line; and
    a second drain area facing the second source area based on the second channel area.

5. The liquid crystal display according to the claim 1,
    wherein the first semiconductor layer has a first segment shape parallel with and overlapping with the data line; and
    wherein the second semiconductor layer has a second segment shape overlapping with the first semiconductor layer.

6. The liquid crystal display according to the claim 5, wherein the drain electrode has an 'L' shape overlapping with the data line and the gate line.

7. The liquid crystal display according to the claim 1,
    wherein the first semiconductor layer has a first segment shape parallel with and overlapped with the data line; and
    wherein the second semiconductor layer has a second segment shape detoured around the first semiconductor layer.

8. The liquid crystal display according to the claim 7,
    wherein one end of the first semiconductor layer is connected to another end of the second semiconductor layer for forming a 'V' shape.

9. The liquid crystal display according to the claim 7,
    wherein the drain electrode has a rectangular shape being extended from the second drain area to the gate line.

10. A liquid crystal display, comprising:
    a first semiconductor layer on a substrate;
    an insulating layer on the first semiconductor layer;
    a second semiconductor layer on the insulating layer;
    a gate electrode overlapped with center portions of the first semiconductor layer and the second semiconductor layer;
    a source electrode connected to a first area of the first semiconductor layer; and
    a drain electrode connected to a second area of the second semiconductor layer,
    wherein a second area of the first semiconductor layer is connected to a first area of the second semiconductor layer.

11. The liquid crystal display according to the claim 10, further comprising:
    a gate insulating layer under the first semiconductor layer; and
    an intermediate insulating layer on the second semiconductor layer,
    wherein the gate electrode is disposed under the gate insulating layer, and
    wherein the source electrode and the drain electrode are disposed on the intermediate insulating layer.

12. The liquid crystal display according to the claim 10, further comprising:
    an intermediate insulating layer on the second semiconductor layer;
    wherein the insulating layer includes a first insulating layer and a second insulating layer sequentially stacked;
    wherein the gate electrode is disposed between the first insulating layer and the second insulating layer; and
    wherein the source electrode and the drain electrode is disposed on the intermediate insulating layer.

13. The liquid crystal display according to the claim 10, further comprising:
    an intermediate insulating layer on the second semiconductor layer;
    wherein the insulating layer includes a first insulating layer and a second insulating layer sequentially stacked;
    wherein the gate electrode is disposed between the first insulating layer and the second insulating layer; and
    wherein the source electrode and the drain electrode is disposed on the second insulating layer.

14. The liquid crystal display according to the claim 10, further comprising:
    a planar layer on the source electrode and the drain electrode;

a common electrode on the planar layer;
a passivation layer on the common electrode; and
a pixel electrode connected to the drain electrode on the passivation layer.

* * * * *